(12) United States Patent
Herr et al.

(10) Patent No.: US 10,367,483 B1
(45) Date of Patent: Jul. 30, 2019

(54) JOSEPHSON CURRENT SOURCE SYSTEM

(71) Applicants: Quentin P. Herr, Ellicott City, MD (US); Anna Y. Herr, Ellicott City, MD (US); Donald L. Miller, Export, PA (US); Christopher S. Bulla, Ellicott City, MD (US); Theodore R. Blank, Columbia, MD (US)

(72) Inventors: Quentin P. Herr, Ellicott City, MD (US); Anna Y. Herr, Ellicott City, MD (US); Donald L. Miller, Export, PA (US); Christopher S. Bulla, Ellicott City, MD (US); Theodore R. Blank, Columbia, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/227,883

(22) Filed: Dec. 20, 2018

(51) Int. Cl.
*H03K 3/38* (2006.01)
*G06N 10/00* (2019.01)
*H03K 19/195* (2006.01)
*H02M 7/04* (2006.01)

(52) U.S. Cl.
CPC ............... *H03K 3/38* (2013.01); *G06N 10/00* (2019.01); *H02M 7/04* (2013.01); *H03K 19/1952* (2013.01)

(58) Field of Classification Search
CPC .... H03K 3/38; H03K 19/195; H03K 19/1952; H03K 19/1954; H03K 19/1958; G06N 10/00; G06N 99/00; H02M 7/04; B82Y 10/00; H01L 39/223; G11C 19/32
See application file for complete search history.

(56) References Cited

U.S. PATENT DOCUMENTS

| 9,174,840 | B2 | 11/2015 | Herr et al. | |
| 9,467,126 | B1* | 10/2016 | Naaman | H03K 3/38 |
| 10,122,350 | B2* | 11/2018 | Miller | H03K 3/38 |
| 2007/0052441 | A1* | 3/2007 | Taguchi | H03K 3/38 |
| | | | | 326/3 |

(Continued)

OTHER PUBLICATIONS

Herr: "Stacked Double-Flux-Quantum Output Amplifier"; IEEE Transactions on Applied Superconductivity, vol. 15, No. 2, Jun. 2015, p. 259-262.

(Continued)

*Primary Examiner* — Gary L Laxton
(74) *Attorney, Agent, or Firm* — Tarolli, Sundheim, Covell & Tummino LLP

(57) ABSTRACT

One embodiment describes a Josephson current source system comprising a flux-shuttle loop that is inductively coupled with an AC input signal. The flux-shuttle loop includes a plurality of stages each comprising at least one Josephson junction. The plurality of stages can be spaced about the flux shuttle loop. Each of a plurality of pairs of the plurality of stages are configured to concurrently trigger in a sequence via the respective at least one Josephson junction in response to the AC input signal and to provide a respective pair of single-flux quantum (SFQ) pulses that move sequentially and continuously through each stage of the plurality of stages around the flux-shuttle loop via each of the at least one Josephson junction of each of the respective stages that results in a DC output current being provided through an output inductor.

20 Claims, 3 Drawing Sheets

(56) References Cited

U.S. PATENT DOCUMENTS

| 2015/0092465 A1* | 4/2015 | Herr | B82Y 10/00 |
| | | | 363/125 |
| 2016/0164505 A1* | 6/2016 | Naaman | H03K 3/38 |
| | | | 327/528 |

OTHER PUBLICATIONS

Semenov, et al.: "New AC-Powered SFQ Digital Circuits".

* cited by examiner

US 10,367,483 B1

JOSEPHSON CURRENT SOURCE SYSTEM

GOVERNMENT INTEREST

The invention was made under Government Contract Number W911NF-14-C-0115. Therefore, the US Government has rights to the invention as specified in that contract.

TECHNICAL FIELD

The present invention relates generally to quantum and classical digital superconducting circuits, and specifically to a Josephson current source system.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux superconducting circuitry, utilizing superconducting Josephson junctions, and can exhibit typical signal power of around 4 nW (nanowatts) at a typical data rate of 20 Gb/s (gigabytes/second) or greater, and can operate at temperatures of around 4° Kelvin. The Josephson junction is an active device that is supplied with a DC bias current, and the power budget in such circuits is dominated by static power consumption which happens whether or not the active device is switching. Typical systems can provide the DC bias current directly using a bias resistor network, which can result in substantially high currents (equal to or greater than an amp), which can result in spurious magnetic fields and heat resulting from high power dissipation.

SUMMARY

One embodiment describes a Josephson current source system comprising a flux-shuttle loop that is inductively coupled with an AC input signal. The flux-shuttle loop includes a plurality of stages each comprising at least one Josephson junction. The plurality of stages can be spaced about the flux shuttle loop. Each of a plurality of pairs of the plurality of stages are configured to concurrently trigger in a sequence via the respective at least one Josephson junction in response to the AC input signal and to provide a respective pair of single-flux quantum (SFQ) pulses that move sequentially and continuously through each stage of the plurality of stages around the flux-shuttle loop via each of the at least one Josephson junction of each of the respective stages that results in a DC output current being provided through an output inductor.

Another embodiment includes a method for providing a DC output current. The method includes providing a bias current to a flux-shuttle loop comprising a plurality of stages. The method also includes providing a reciprocal quantum logic (RQL) clock signal that is inductively coupled with each of the plurality of stages to sequentially trigger at least one Josephson junction associated with each of the plurality of stages in response to the RQL clock signal and the bias current to continuously circulate a pair of single-flux quantum (SFQ) pulses around the flux-shuttle loop via each of the at least one Josephson junction associated with each of the plurality of stages to generate the DC output current through an output inductor.

Another embodiment includes a Josephson current source system. The system includes a flux-shuttle loop that is inductively coupled with an AC input signal. The flux-shuttle loop can include a plurality of Josephson transmission line (JTL) stages each comprising at least one Josephson junction and being referenced to a floating reference node. The plurality of JTL stages can be spaced about the flux shuttle loop. Each of the plurality of JTL stages are configured to trigger in a sequence via the respective at least one Josephson junction in response to the AC input signal and to provide a respective single-flux quantum (SFQ) pulse that moves sequentially and continuously through each stage of the plurality of stages around the flux-shuttle loop via each of the at least one Josephson junction of each of the respective JTL stages that results in a DC output current being provided through an output inductor.

DETAILED DESCRIPTION

The present invention relates generally to quantum and classical digital superconducting circuits, and specifically to a Josephson current source system. The Josephson current source system includes a flux-shuttle loop comprising a plurality of stages. Each of the plurality of stages can be configured as a Josephson transmission line (JTL) that comprises a transformer, at least one Josephson junction, and at least one inductor. The transformer is configured to inductively couple an AC input signal to the flux-shuttle loop, such that the AC input signal provides a bias for the Josephson junctions in the respective JTL stage. For example, the AC input signal can be an RQL clock signal that includes an in-phase component and a quadrature-phase component. As provided herein, the in-phase and quadrature-phase components each correspond to separate sinusoidal signals (e.g., out-of-phase by 90°) that are collectively described as a single "RQL clock signal". The stages are arranged as respective pairs, with each pair being activated in response to a given phase of the AC input signal based on the induced phase.

The flux-shuttle loop also includes at least one initialization transformer configured to generate a bias initialization current in response to a DC bias current. Thus, in response to the bias current provided via the initialization transformer and the bias provided by the AC input signal via the transformers in each of the stages, the Josephson junction(s) in each of the stages of a given pair triggers in a pair-wise sequence to provide a respective pair of single-flux quantum (SFQ) pulses around the flux-shuttle loop based on the frequency of the AC input signal. As an example, the SFQ pulses can propagate through each of the pairs of stages at each positive and negative cycle of the AC input signal. The SFQ pulses are provided to the inductor of each of the plurality of stages to provide respective current pulses to an output inductor, such that the output inductor provides a DC output current.

In addition, the stages (e.g., JTL stages) of the flux shuttle loop can be arranged relative to a floating reference node as a common, as opposed to a system-wide "ground" connection. As a result, the Josephson current source system can include multiple flux shuttle loops. As an example, a given one of the flux shuttle loops can have an output coupled to the floating reference node of another flux shuttle loop. Multiple flux shuttle loops can be cascaded in this manner, such that each of the flux shuttle loops can provide an additive $2\Phi_0$ at each phase of the AC input signal to provide, referenced additively in the cascade, to the output inductor to provide a greater amplitude of the output current.

Figure 1:
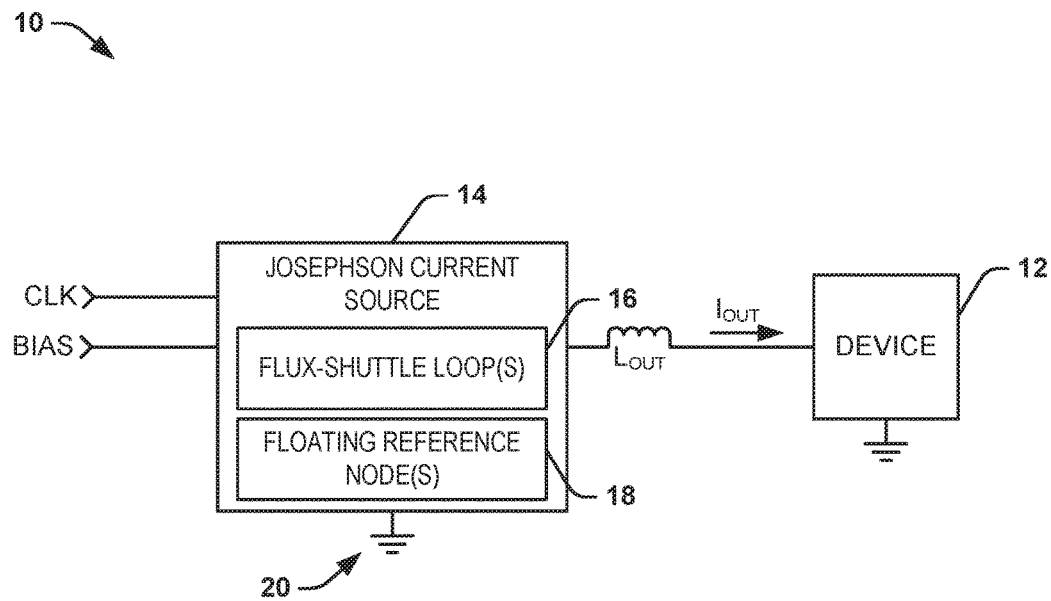
FIG. 1 illustrates an example of a superconducting circuit system.

FIG. 1 illustrates an example of a superconducting circuit system 10. As an example, the superconducting circuit system 10 can be implemented in any of a variety of quantum computing applications, such as quantum memory or processing systems. The superconducting circuit system 10 includes a device 12 and a Josephson current source system 14. The Josephson current source system 14 is configured to provide a DC current, demonstrated in the example of FIG. 1 as a DC current $I_{DC}$, to the device 12. As an example, the DC current $I_{DC}$ can be provided as a power signal or as a driver signal to drive the device 12. For example, the device 12 can correspond to a current driver for a memory system (e.g., an array of memory cells), such that the device 12 configured as a current driver can provide a read current or a write current to a row or column of memory cells.

The Josephson current source system 14 is configured to convert an AC input signal CLK to the DC current $I_{DC}$. As an example, the AC input signal CLK can be a sinusoidal waveform having a substantially constant frequency (e.g., approximately 10 GHz) and a low AC current magnitude. For example, the AC input signal CLK can correspond to a clock signal, such as a reciprocal quantum logic (RQL) clock signal (e.g., as implemented in superconducting circuits (e.g., approximately 2 mA RMS)). The Josephson current source system 14 is demonstrated as receiving a bias signal BIAS that can be provided to the Josephson current source system 14 to initialize the operation of the Josephson current source system 14 to convert the AC input signal CLK to the DC current $I_{DC}$. As an example, the bias signal BIAS can be a DC current that is substantially continuously provided to the Josephson current source system 14 to maintain the operation of the Josephson current source system 14. For example, the bias signal BIAS can induce a bias initialization current via a pair of transformers, as described in greater detail herein.

In the example of FIG. 1, the Josephson current source system 14 includes a flux-shuttle loop 16. The flux-shuttle loop 16 can include a plurality of stages that are configured to transfer a pair of single-flux quantum (SFQ) pulses around the flux-shuttle loop 16 during operation of the Josephson current source system 14 based on the frequency of the AC input signal CLK, such as via an adjacent pair of the stages. As described herein, the term "loop" with respect to the flux-shuttle loop 16 describes a substantially continuous loop (e.g., circular) arrangement of the stages of the flux-shuttle loop 16, such that a first stage can be coupled to a last stage (e.g., through an initialization transformer). Therefore, the SFQ pulses can substantially continuously propagate around the flux-shuttle loop 16 while the bias signal BIAS is provided. As an example, the stages of the flux shuttle loop 16 can be configured as Josephson transmission line (JTL) stages, as described in greater detail herein.

The flux-shuttle loop 16 can be arranged without resistors. As an example, each of the stages of the flux-shuttle loop 16 can include a transformer, at least one Josephson junction, and at least one inductor. The transformer can be configured to inductively couple the AC input signal CLK to the flux-shuttle loop 16, such that the AC input signal CLK provides a bias in the flux-shuttle loop 16. The bias induced by the AC input signal CLK via the transformer can be added to the bias initialization current generated via the bias signal BIAS. Thus, in response to the collective bias, the Josephson junction(s) in each of the stages of the flux-shuttle loop 16 triggers to generate the SFQ pulse that propagates around the flux-shuttle loop 16 based on the frequency of the AC input signal CLK. As an example, the SFQ pulse can propagate through a pair of the stages at each positive and each negative cycle of the AC input signal CLK. Therefore, a pair of SFQ pulses propagate around the flux-shuttle loop 16 and can be provided to a respective storage inductor associated with each of the respective pair of stages of the flux-shuttle loop 16 to provide a current pulse, such as to an output inductor $L_{OUT}$ in the Josephson current source system 14. Therefore, the DC current $I_{DC}$ can flow through the output inductor $L_{OUT}$ based on the current pulses being sequentially provided to the output inductor LOUT based on the frequency of the AC input signal CLK. For example, the current pulses can be generated based on the SFQ pulses providing a small voltage (e.g., approximately 2 μV/GHz) to each of the inductors, such that the resulting current pulses can be integrated in the output inductor to provide the DC current $I_{DC}$.

In addition, the Josephson current source system 14 includes one or more floating reference nodes 18 that can each correspond to a respective one of the flux shuttle loop(s) 16. As an example, the floating reference node(s) 18 can correspond to local voltage references, as opposed to a global ground associated with the Josephson current source system 14, demonstrated in the example of FIG. 1 at 20. As an example, the flux shuttle loop(s) 16 can be arranged in a cascaded, or "stacked" arrangement, in which an output of a given one of the flux shuttle loop(s) 16 can be coupled to a floating reference node 18 of a next flux shuttle loop 16. Therefore, the voltage pulses that are provided by the subsequent flux shuttle loop(s) 16 in the cascaded or stacked arrangement can be additive with respect to each other, such that a pair of SFQ pulses can provide an additive $2\Phi_0$ per cycle of the AC input signal CLK of each of the flux shuttle loop(s) 16. The last of the flux shuttle loop(s) 16 can thus have an output coupled to the output inductor $L_{OUT}$ to provide substantially larger output SFQ pulses through the output inductor $L_{OUT}$, and thus to provide a substantially greater amplitude of the output current $I_{OUT}$ to the device 12.

The Josephson current source system 14 can therefore operate to convert the AC input signal CLK to the DC current $I_{DC}$ in a power efficient manner. As described previously, the Josephson current source system 14 can be implemented without resistors. Therefore, the Josephson current source system 14 only dissipates power via the current pulses to provide the DC current $I_{DC}$ to the device 12, such that no additional power is dissipated to maintain the SFQ pulse propagating around the flux-shuttle loop 16. In addition, the Josephson current source system 14 can generate substantially no heat from static power dissipation, as opposed to typical resistance-based DC power sources. Accordingly, the Josephson current source system 14 can operate more efficiently and effectively than typical AC/DC converters, particularly in a quantum computing environment. Furthermore, by implementing each of the flux shuttle loop(s) 16 to provide two SFQ pulses in each cycle of the AC input signal CLK, and by providing the cascaded/stacked arrangement of multiple flux shuttle loops 16, the output current $I_{OUT}$ can be provided at a greater amplitude and/or can be restored to maximum amplitude in a more rapid manner, such as relative to other flux shuttle loop current sources.

Figure 2:
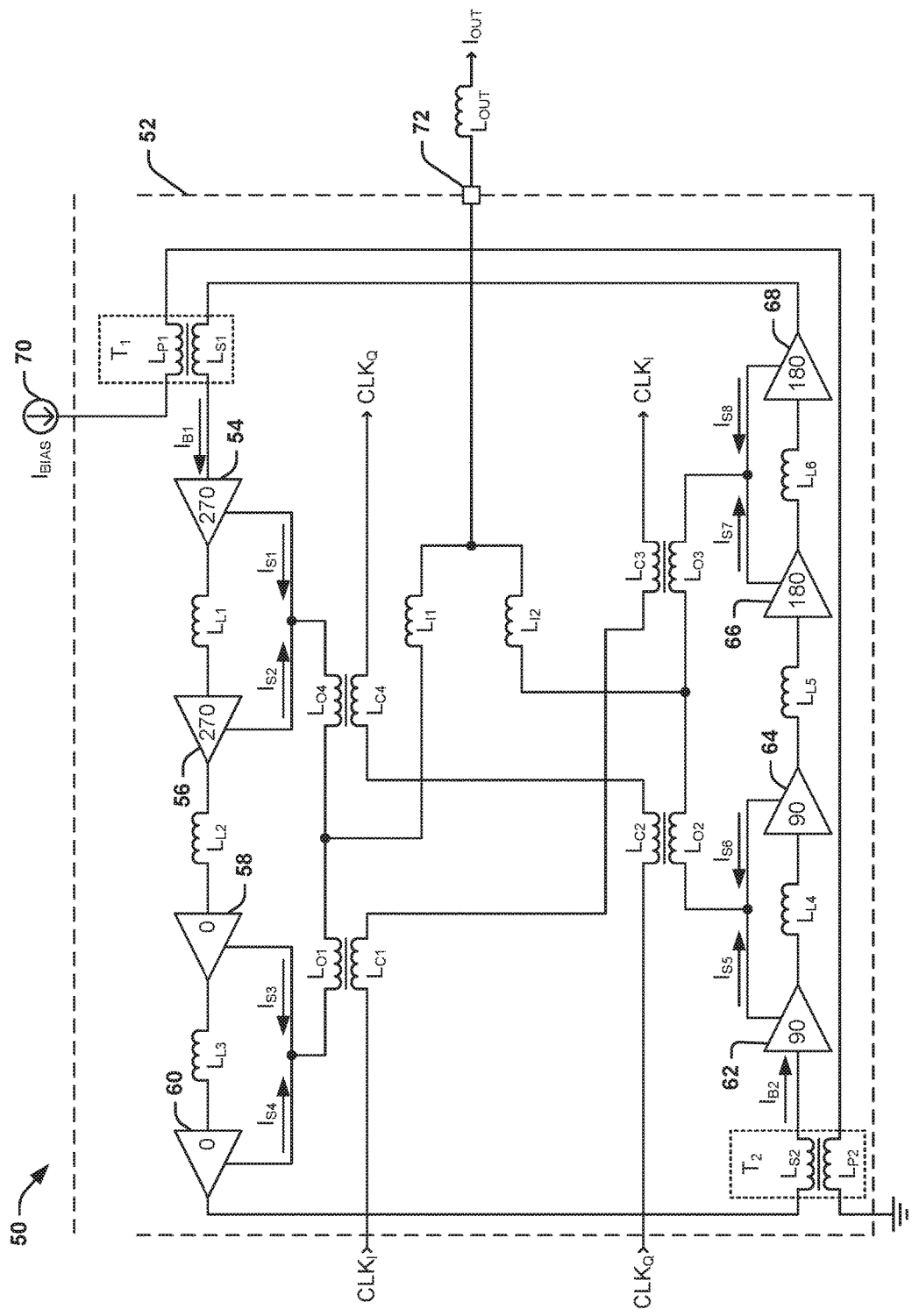
FIG. 2 illustrates an example of a Josephson current source system.

FIG. 2 illustrates an example of a Josephson current source system 50. The Josephson current source system 50 can correspond to Josephson current source system 14 in the superconducting circuit system 10. Therefore, the Josephson current source system 50 includes a flux-shuttle loop 52 that includes a plurality of stages, demonstrated in the example of FIG. 2 as a first stage 54, a second stage 56, a third stage 58, a fourth stage 60, a fifth stage 62, a sixth stage 64, a seventh stage 66, and an eighth stage 68. The stages 54, 56, 58, 60, 62, 64, 66, and 68 are sequentially coupled to form a loop arrangement. The Josephson current source system 50 is configured to convert an AC input signal CLK to a DC output current $I_{OUT}$. In the example of FIG. 2, the AC input signal CLK is demonstrated as an RQL clock signal including an in-phase component $CLK_I$ and a quadrature-phase component $CLK_Q$. As an example, the in-phase component $CLK_I$ and the quadrature-phase component $CLK_Q$ can collectively correspond to AC input signal that is implemented for RQL in quantum computing circuits. The DC output current $I_{OUT}$ is demonstrated as flowing through an output inductor $L_{OUT}$.

Each of the stages 54, 56, 58, 60, 62, 64, 66, and 68 are configured substantially similarly with respect to each other, and can correspond to JTL stages. The first stage 54 is coupled to the second stage 56 via an inductor $L_{L1}$, and the second stage 56 is coupled to the third stage 58 via an inductor $L_{L2}$. The first and second stages 54 and 56 are each associated with a 270° phase of the AC input signal CLK, and thus a first phase of the quadrature-phase component $CLK_Q$. The third stage 58 is coupled to the fourth stage 60 via an inductor $L_{L3}$. The third and fourth stages 58 and 60 are each associated with a 0° phase of the AC input signal CLK, and thus a first phase of the in-phase component $CLK_I$. The fifth stage 62 is coupled to the sixth stage 64 via an inductor $L_{L4}$, and the sixth stage 64 is coupled to the seventh stage 66 via an inductor $L_{L5}$. The fifth and sixth stages 62 and 64 are each associated with a 90° phase of the AC input signal CLK, and thus a second phase of the quadrature-phase component $CLK_Q$. The seventh stage 66 is coupled to the eighth stage 68 via an inductor $L_{L6}$. The seventh and eighth stages 66 and 68 are each associated with a 180° phase of the AC input signal CLK, and thus a second phase of the in-phase component $CLK_I$.

In the example of FIG. 2, the in-phase component $CLK_I$ propagates through an inductor $L_{C1}$ and an inductor $L_{C3}$. The inductor $L_{C1}$ is inductively coupled to a first storage inductor $L_{O1}$, and the inductor $L_{C3}$ is inductively coupled to a third storage inductor $L_{O3}$. Therefore, the in-phase component $CLK_I$ can provide a bias to the stages 58 and 60 during a first phase of the in-phase portion $CLK_I$, and can provide a bias to the stages 66 and 68 during a second (opposite) phase of the in-phase portion $CLK_I$, such as based on an opposite winding orientation of the inductors $L_{C3}$ and $L_{O3}$ relative to the inductors $L_{C1}$ and $L_{O1}$. Similarly, the quadrature-phase component $CLK_Q$ propagates through an inductor $L_{C2}$ and an inductor $L_{C4}$. The inductor $L_{C2}$ is inductively coupled to a second storage inductor $L_{O2}$, and the inductor $L_{C4}$ is inductively coupled to a fourth storage inductor $L_{O4}$. Therefore, the quadrature-phase component $CLK_Q$ can provide a bias to the stages 62 and 64 during a first phase of the quadrature-phase component $CLK_Q$, and can provide a bias to the stages 54 and 56 during a second (opposite) phase of the quadrature-phase component $CLK_Q$, such as based on an opposite winding orientation of the inductors $L_{C4}$ and $L_{O4}$ relative to the inductors $L_{C2}$ and $L_{O2}$.

In addition, the Josephson current source system 50 includes a first initialization transformer $T_1$ and a second initialization transformer $T_2$. The first initialization transformer $T_1$ is arranged between the eighth stage 68 and the first stage 54 and includes a primary winding $L_{P1}$ and a secondary winding $L_{S1}$. The second initialization transformer $T_2$ is arranged between the fourth stage 60 and the fifth stage 62 and includes a primary winding $L_{P2}$ and a secondary winding $L_{S2}$. A DC bias current $I_{BIAS}$ is provided from a current source 70 and flows through the primary windings $L_{P1}$ and $L_{P2}$ of each of the transformers $T_1$ and $T_2$. The bias current $I_{BIAS}$ induces a first bias initialization current $I_{B1}$ via the secondary inductor $L_{S1}$ that flows through the stages 54, 56, 58, and 60 to ground and a second bias initialization current $I_{B1}$ via the secondary inductor $L_{S2}$, respectively, that flows through the stages 62, 64, 66, and 68 to ground. As an example, the bias currents each correspond to a flux quantum that propagates around the flux shuttle loop 52 as driven by the clock signal CLK.

Figure 3:
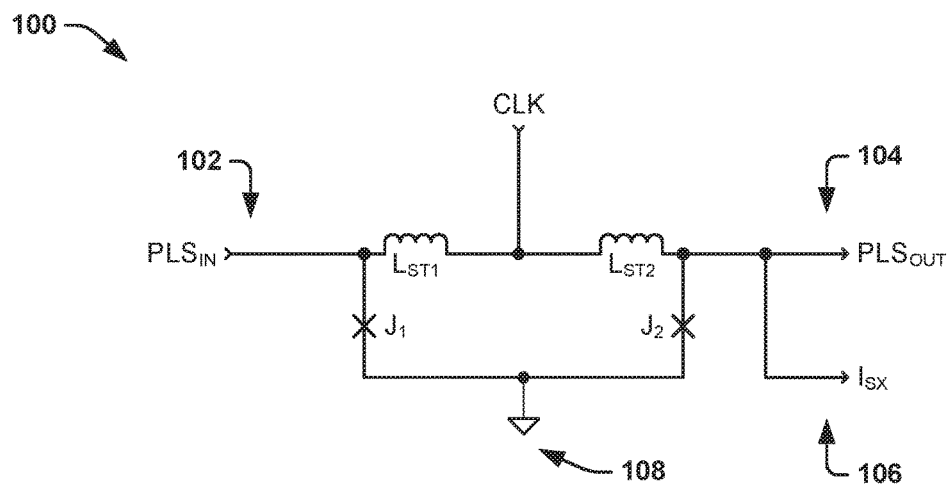
FIG. 3 illustrates an example of a Josephson transmission line (JTL) stage.

As described previously, the stages 54, 56, 58, 60, 62, 64, 66, and 68 can be arranged as JTL stages. FIG. 3 illustrates an example of a JTL stage 100. The JTL stage 100 can correspond to any one of the substantially similarly arranged JTL stages 54, 56, 58, 60, 62, 64, 66, and 68 in the example of FIG. 2. Therefore, reference is to be made to the example of FIG. 2 in the following description of the example of FIG. 3.

The JTL stage 100 is demonstrated in the example of FIG. 3 to receive the AC input signal CLK, such as via one of the respective inductors $L_{O1}$, $L_{O2}$, $L_{O3}$, or $L_{O4}$. Therefore, the JTL stage 100 receives one of the first and second phase of a respective one of the in-phase component $CLK_I$ or the quadrature-phase component $CLK_Q$. For example, the JTL stage 100 corresponding to one of the stages 54 and 56 can provide the bias at 270° phase, the JTL stage 100 corresponding to one of the stages 58 and 60 can provide the bias at 0° phase, the JTL stage 100 corresponding to one of the stages 62 and 64 can provide the bias at 90° phase, and the JTL stage 100 corresponding to one of the stages 66 and 68 can provide the bias at 180° phase.

In the example of FIG. 3, an SFQ pulse $PLS_{IN}$ can be provided at an input 102, such as from a previous JTL stage. In response to being biased by the AC input signal CLK and the bias initialization current $I_{B1}$ or $I_{B2}$, the SFQ pulse $PLS_{IN}$ can trigger a first Josephson junction $J_1$ that propagates SFQ pulse $PLS_{IN}$ through an inductor $L_{ST1}$ and through an inductor $L_{ST2}$ to trigger a second Josephson junction $J_2$. The SFQ pulse generated by the second Josephson junction $J_2$ is thus provided from the JTL stage 100 as an output SFQ pulse $PLS_{OUT}$ at a first output 104. The output SFQ pulse $PLS_{OUT}$ can thus propagate to a next JTL stage 100 in the flux shuttle loop 52 to be the input SFQ pulse $PLS_{IN}$ in the next JTL stage 100. In addition, the triggering of the Josephson junctions $J_1$ and $J_2$ can provide a current pulse $I_{SX}$ that is provided at a second output 106.

In addition, the Josephson junctions $J_1$ and $J_2$ are referenced to a floating reference node, demonstrated in the example of FIG. 3 at 108. As an example, the floating reference node 108 can correspond to local voltage references, as opposed to a global ground associated with the Josephson current source system 50. For example, the floating voltage reference node 108 can be separate and distinct from the ground connection associated with the bias current $I_{BIAS}$ and associated with the AC input signal CLK. As described in greater detail herein, the floating reference node 108 can be implemented to boost an amplitude of the current pulses $I_{SX}$ provided from the JTL stage 100 relative to another flux shuttle loop 50 having an output that is coupled to the floating reference node 108 in a cascaded, or "stacked" arrangement.

Referring back to the example of FIG. 2, each of the stages 54, 56, 58, 60, 62, 64, 66, and 68 are demonstrated as providing the current pulse $I_{SX}$ to a respective storage inductor at the associated phase of the AC input signal CLK. In the example of FIG. 2, the first storage inductor $L_{O1}$ receives a current pulse $I_{S3}$ from the third stage 58 and a current pulse Iso from the fourth stage 60 at the 0° phase of the AC input signal CLK. Therefore, the current pulses $I_{S3}$ and Iso are combined in the first storage inductor $L_{O1}$. Similarly, the second storage inductor Lot receives a current pulse $I_{S5}$ from the fifth stage 62 and a current pulse $I_{S6}$ from the sixth stage 64 at the 90° phase of the AC input signal CLK. Therefore, the current pulses $I_{S5}$ and $I_{S6}$ are combined in the second storage inductor $L_{O2}$. Similarly, the third storage inductor $L_{O3}$ receives a current pulse $I_{S7}$ from the seventh stage 66 and a current pulse $I_{S8}$ from the eighth stage 68 at the 180° phase of the AC input signal CLK. Therefore, the current pulses $I_{S7}$ and $I_{S8}$ are combined in the third storage inductor $L_{O3}$. Similarly, the fourth storage inductor $L_{O4}$ receives a current pulse $I_{S1}$ from the first stage 54 and a current pulse $I_{S2}$ from the second stage 56 at the 270° phase of the AC input signal CLK. Therefore, the current pulses $I_{S1}$ and $I_{S2}$ are combined in the fourth storage inductor $L_{O4}$.

The storage inductors $L_{O1}$ and $L_{O4}$ are each coupled to an intermediate inductor $L_{I1}$ and the storage inductors $L_{O2}$ and $L_{O3}$ are each coupled to an intermediate inductor $L_{I2}$. The intermediate inductors $L_{I1}$ and $L_{I2}$ are each coupled to an output 72 of the flux shuttle loop 52. In the example of FIG. 2, the output 72 is coupled to the output inductor $L_{OUT}$. As a result, the intermediate inductor $L_{I1}$ integrates the current pulses $I_{S1}$, $I_{S2}$, $I_{S3}$, and $I_{S4}$, and the intermediate inductor $L_{I2}$ integrates the current pulses $I_{S5}$, $I_{S6}$, $I_{S7}$, and $I_{S8}$. The integrated current pulses $I_{S1}$, $I_{S2}$, $I_{S3}$, $I_{S4}$, $I_{S5}$, $I_{S6}$, $I_{S7}$, and $I_{S8}$ are thus further integrated at the output inductor $L_{OUT}$ to provide the DC output current $I_{OUT}$, such that the Josephson current source system 50 acts as a current-limited DC signal source based on current limitation of the output inductor $L_{OUT}$. As a result, the DC output current $I_{OUT}$ can be provided to a device (e.g., the device 12 in the example of FIG. 1). Additionally, because the current pulses $I_{S1}$, $I_{S2}$, $I_{S3}$, $I_{S4}$, $I_{S5}$, $I_{S6}$, $I_{S7}$, and $I_{S8}$ are provided to the output inductor $L_{OUT}$ (e.g., via the intermediate inductors $L_{I1}$ and $L_{I2}$) in pairs based on the two SFQ pulses propagating around the flux shuttle loop 52 at each phase of the AC input signal CLK, the amplitude of the output current $I_{OUT}$ can be increased rapidly, such as relative to other Josephson current source systems.

While the storage inductors $L_{O1}$, $L_{O2}$, $L_{O3}$, and $L_{O4}$ are coupled (e.g., via the intermediate inductors $L_{I1}$ and $L_{I2}$) to the output inductor $L_{OUT}$ in the example of FIG. 2, the output 72 can instead be coupled to a floating reference node associated with another flux shuttle loop 52. For example, the flux shuttle loop 52 can be a last flux shuttle loop 52 in a cascaded or stacked arrangement to provide the output current $I_{OUT}$ through the output inductor $L_{OUT}$ to the device 12, with one or more preceding flux shuttle loops 52 having a respective output 72 coupled to the floating reference node of the flux shuttle loop 52 demonstrated in the example of FIG. 2.

Figure 4:
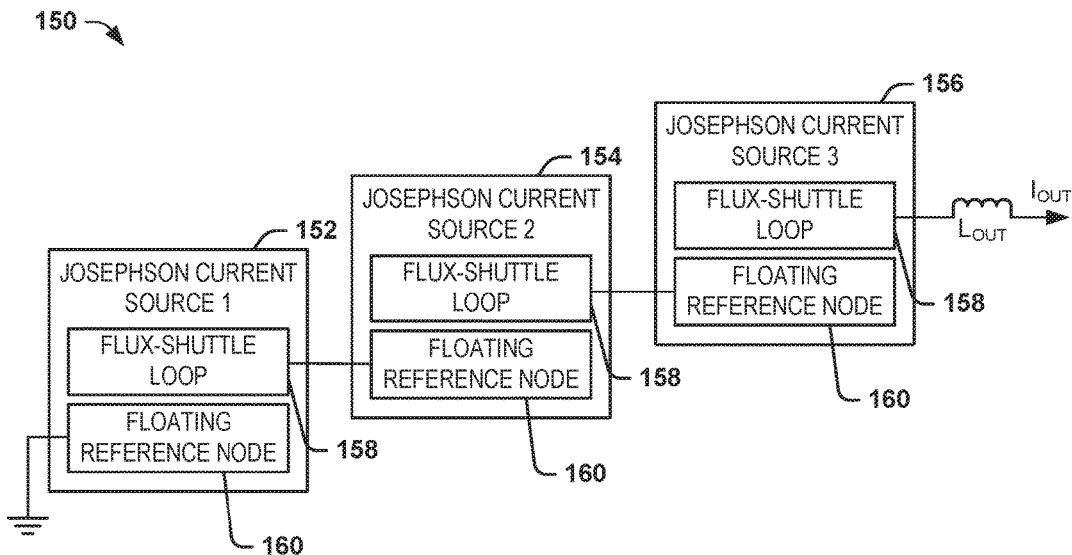
FIG. 4 illustrates another example of a superconducting circuit system.

FIG. 4 illustrates another example of a superconducting circuit system 150. The superconducting circuit system 150 can be implemented similar to the superconducting system 10 in the example of FIG. 1, and can thus be configured to provide an output current $I_{OUT}$ to a device (e.g., the device 12) in response to an AC input signal (e.g., an RQL clock signal). The superconducting circuit system 150 includes a plurality of Josephson current source systems, demonstrated as a first Josephson current source system 152, a second Josephson current source system 154, and a third Josephson current source system 156. Each of the Josephson current source systems 152 can be configured substantially similar to the Josephson current source systems 50 in the example of FIG. 2. Therefore, reference is to be made to the example of FIG. 2 in the following description of the example of FIG. 4. Additionally, while the example of FIG. 4 demonstrates three Josephson current source systems, it is to be understood that fewer or greater than three Josephson current source systems can be implemented instead.

Each of the Josephson current source systems 152, 154, and 156 include a flux-shuttle loop 158 and a floating reference node 160. The flux-shuttle loop 158 of each of the Josephson current source systems 152, 154, and 156 can include a plurality of stages that are configured to transfer a pair of SFQ pulses around the flux-shuttle loop 158 during operation of the respective Josephson current source systems 152, 154, and 156 based on the frequency of the AC input signal CLK, such as via an adjacent pair of the stages, similar to as described herein. Therefore, the flux shuttle loop 158 of each of the Josephson current source systems 152, 154, and 156 can provide a pair of respective current pulses at each phase of the AC input signal CLK.

In addition, the floating reference node 160 of the first Josephson current source system 152 is grounded, and the output of the flux shuttle loop 158 of the first Josephson current source system 152 is coupled to the floating reference node 160 of the second Josephson current source system 154. Similarly, the output of the flux shuttle loop 158 of the second Josephson current source system 154 is coupled to the floating reference node 160 of the third Josephson current source system 156. The output of the flux shuttle loop 158 of the third Josephson current source system 156 is configured to provide the output current $I_{OUT}$ via the storage inductor $L_{OUT}$. Therefore, the Josephson current source systems 152, 154, and 156 are arranged in a cascaded, or "stacked" arrangement. Therefore, the voltage pulses that are provided by the flux shuttle loops 158 in each of the Josephson current source systems 152, 154, and 156 can be additive with respect to each other, such that a pair of SFQ pulses from the flux shuttle loop 158 of each of the Josephson current source systems 152, 154, and 156 can provide an additive $2\Phi_0$ per cycle of the AC input signal CLK. The flux shuttle loop 158 of the third Josephson current source system 156 can thus have an output coupled to the output inductor $L_{OUT}$ to provide substantially larger output SFQ pulses through the output inductor $L_{OUT}$, and thus to provide a substantially greater amplitude of the output current $I_{OUT}$ to the associated device.

Figure 5:
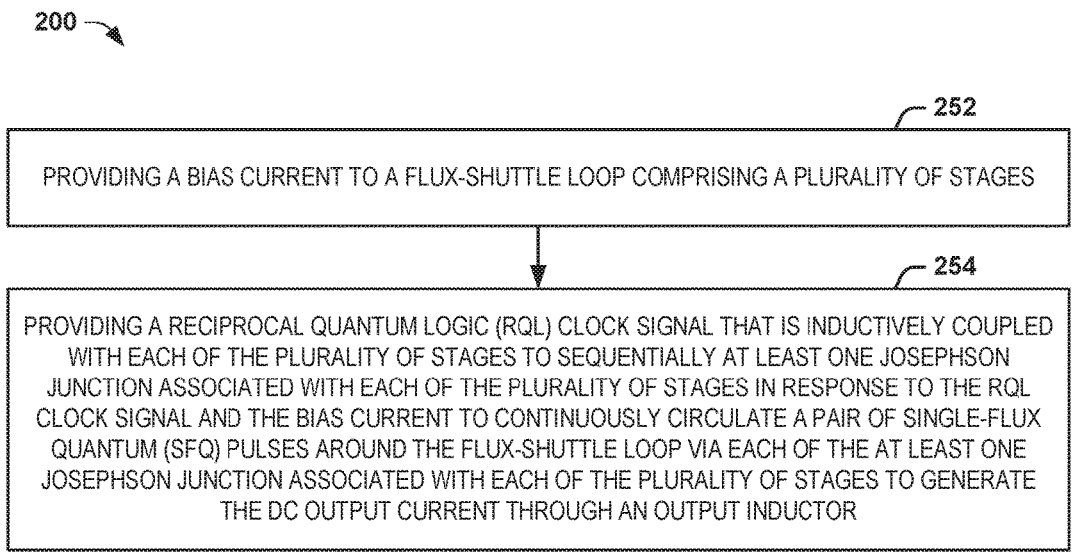
FIG. 5 illustrates an example of a method for providing a DC output current.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 5 illustrates an example of a method 200 for providing a DC output current (e.g., the DC output current $I_{OUT}$). At 252, a bias current (e.g., the bias current $I_{BIAS}$) is provided to a flux-shuttle loop (e.g., the flux-shuttle loop 16) comprising a plurality of stages (e.g., the stages 54, 56, 58, 60, 62, 64, 66, and 68). At 254, an RQL clock signal (e.g., the AC input signal CLK) that is inductively coupled with each of the plurality of stages to trigger sequentially at least one Josephson junction (e.g., the Josephson junctions $J_1$ and $J_2$) associated with each of the plurality of stages in response to the RQL clock signal and the bias current to continuously circulate a pair of SFQ pulses around the flux-shuttle loop via each of the at least one Josephson junction associated with each of the plurality of stages to generate the DC output current through an output inductor (e.g., the storage inductor $L_{OUT}$).

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A Josephson current source system comprising a flux-shuttle loop that is inductively coupled with an AC input signal, the flux-shuttle loop comprising a plurality of stages each comprising at least one Josephson junction, the plurality of stages being spaced about the flux shuttle loop, wherein each of a plurality of pairs of the plurality of stages are configured to concurrently trigger in a sequence via the respective at least one Josephson junction in response to the AC input signal and to provide a respective pair of single-flux quantum (SFQ) pulses that move sequentially and continuously through each stage of the plurality of stages around the flux-shuttle loop via each of the at least one Josephson junction of each of the respective stages that results in a DC output current being provided through an output inductor.

2. The system of claim 1, wherein the AC input signal is configured as a reciprocal quantum logic (RQL) clock signal comprising an in-phase component and a quadrature-phase component.

3. The system of claim 2, wherein each of the stages is coupled with a respective one of the in-phase component and the quadrature-phase component to bias the respective at least one Josephson junction.

4. The system of claim 1, wherein each of the plurality of stages is arranged as a Josephson transmission line (JTL) stage that is configured to be biased via a respective phase of the AC input signal.

5. The system of claim 4, wherein each of the plurality of JTL stages is referenced to a floating reference node.

6. The system of claim 5, wherein the flux shuttle loop is a first flux shuttle loop of a plurality of flux shuttle loops each comprising an output, the output of at least one of the plurality of flux shuttle loops being coupled to the floating reference node of another at least one of the plurality of flux shuttle loops to provide an additive $2\Phi_0$ per cycle of the AC input signal of each of the plurality of flux shuttle loops through the output inductor.

7. The system of claim 1, wherein the flux-shuttle loop further comprises at least one initialization transformer having a secondary winding configured to provide an initialization bias current in the flux-shuttle loop in response to a bias current that is provided through a primary winding of the initialization transformer.

8. The system of claim 7, wherein the at least one initialization transformer comprises a first initialization transformer and a second initialization transformer, wherein each of the first and second initialization transformers are arranged symmetrically about the flux shuttle loop with respect to the plurality of stages.

9. The system of claim 1, wherein the plurality of stages comprises a plurality of pairs of stages, wherein each pair of stages is arranged to trigger the respective at least one Josephson junction in each of the stages associated with the respective pair of stages in response to a predetermined phase of the AC input signal to provide a respective pair of current pulses, wherein each of the pair of stages is coupled to a storage inductor configured to provide the respective pair of current pulses to the output inductor.

10. The system of claim 1, wherein each of the plurality of stages is referenced to a floating reference node, wherein the flux shuttle loop is a first flux shuttle loop of a plurality of flux shuttle loops each comprising an output, the output of at least one of the plurality of flux shuttle loops being coupled to the floating reference node of another at least one of the plurality of flux shuttle loops, wherein a last of the plurality of flux shuttle loops being coupled to the output inductor.

11. A method for providing a DC output current, the method comprising:
  providing a bias current to a flux-shuttle loop comprising a plurality of stages; and
  providing a reciprocal quantum logic (RQL) clock signal that is inductively coupled with each of the plurality of stages to sequentially trigger at least one Josephson junction associated with each of the plurality of stages in response to the RQL clock signal and the bias current to continuously circulate a pair of single-flux quantum (SFQ) pulses around the flux-shuttle loop via each of the at least one Josephson junction associated with each of the plurality of stages to generate the DC output current through an output inductor.

12. The method of claim 11, wherein providing the RQL clock signal comprises providing the RQL clock signal as one of an in-phase component and a quadrature-phase component to a respective pair of the plurality of stages to bias the respective pair of the plurality of stages via a respective phase of the RQL clock signal.

13. The method of claim 11, wherein providing the initialization signal comprises providing the bias current through a primary winding of the initialization transformer to induce an initialization bias current in the flux-shuttle loop.

14. The method of claim 13, wherein providing the bias current comprises providing the bias current through a primary winding of each of a first initialization transformer and a second initialization current that are arranged symmetrically about the flux shuttle loop with respect to the plurality of stages to induce the initialization bias current in the flux-shuttle loop.

15. The method of claim 11, wherein each of the plurality of stages is arranged as a Josephson transmission line (JTL)

stage that is configured to be biased via a respective phase of the RQL clock signal, wherein each of the plurality of JTL stages is referenced to a floating reference node.

16. The method of claim 15, wherein providing the bias current comprises providing the bias current to each of a plurality of flux shuttle loops, wherein providing the RQL clock signal comprises providing the RQL clock signal to each of the plurality of flux shuttle loops, wherein an output of at least one of the plurality of flux shuttle loops is coupled to the floating reference node of another at least one of the plurality of flux shuttle loops to provide an additive $2\Phi_0$ per cycle of the RQL clock signal of each of the plurality of flux shuttle loops through the output inductor.

17. A Josephson current source system comprising a flux-shuttle loop that is inductively coupled with an AC input signal, the flux-shuttle loop comprising a plurality of Josephson transmission line (JTL) stages each comprising at least one Josephson junction and being referenced to a floating reference node, the plurality of JTL stages being spaced about the flux shuttle loop, wherein each of the plurality of JTL stages are configured to trigger in a sequence via the respective at least one Josephson junction in response to the AC input signal and to provide a respective single-flux quantum (SFQ) pulse that moves sequentially and continuously through each stage of the plurality of stages around the flux-shuttle loop via each of the at least one Josephson junction of each of the respective JTL stages that results in a DC output current being provided through an output inductor.

18. The system of claim 17, wherein the AC input signal is configured as a reciprocal quantum logic (RQL) clock signal comprising an in-phase component and a quadrature-phase component, wherein each of the JTL stages comprises a transformer configured to inductively couple the flux-shuttle loop with a respective one of the in-phase component and the quadrature-phase component to bias the respective at least one Josephson junction.

19. The system of claim 18, wherein the plurality of JTL stages comprises a plurality of pairs of JTL stages, wherein each pair of JTL stages is arranged to trigger the respective at least one Josephson junction concurrently in each of the stages associated with the respective pair of JTL stages in response to a predetermined phase of the RQL clock signal to provide a respective pair of current pulses that circulate in the flux shuttle loop, wherein each of the pair of stages is coupled to a storage inductor configured to provide the respective pair of current pulses to the output inductor.

20. The system of claim 17, wherein the flux shuttle loop is a first flux shuttle loop of a plurality of flux shuttle loops each comprising an output, the output of at least one of the plurality of flux shuttle loops being coupled to the floating reference node of another at least one of the plurality of flux shuttle loops to provide an additive $2\Phi_0$ per cycle of the AC input signal of each of the plurality of flux shuttle loops through the output inductor.

* * * * *